(12) United States Patent
Hollis et al.

(10) Patent No.: US 7,733,118 B2
(45) Date of Patent: Jun. 8, 2010

(54) DEVICES AND METHODS FOR DRIVING A SIGNAL OFF AN INTEGRATED CIRCUIT

(75) Inventors: Timothy Hollis, Meridan, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/043,848

(22) Filed: Mar. 6, 2008

(65) Prior Publication Data
US 2009/0224802 A1 Sep. 10, 2009

(51) Int. Cl.
*H03K 17/16* (2006.01)
(52) U.S. Cl. .............................. 326/26; 326/30; 326/83
(58) Field of Classification Search .................. 326/30, 326/86; 327/108, 264
See application file for complete search history.

(56) References Cited

U.S. PATENT DOCUMENTS

| | | | |
|---|---|---|---|
| 3,473,160 A | 10/1969 | Wahlstrom | |
| 3,633,120 A | 1/1972 | Battjes | 330/30 R |
| 4,333,058 A | 6/1982 | Hoover | 330/253 |
| 4,527,079 A | 7/1985 | Thompson | 307/475 |
| 4,658,156 A | 4/1987 | Hashimoto | 307/350 |
| 4,723,110 A | 2/1988 | Voorman | 330/252 |
| 4,797,631 A | 1/1989 | Hsu et al. | 330/253 |
| 4,853,560 A | 8/1989 | Iwamura et al. | 307/296.1 |
| 5,059,835 A | 10/1991 | Lauffer et al. | 307/576 |
| 5,067,007 A | 11/1991 | Kanji et al. | 357/74 |
| 5,144,167 A | 9/1992 | McClintock | 307/475 |
| RE34,808 E | 12/1994 | Hsieh | 326/71 |
| 5,420,538 A | 5/1995 | Brown | 330/252 |
| 5,491,455 A | 2/1996 | Kuo | 330/253 |
| 5,521,530 A | 5/1996 | Yao et al. | 326/80 |
| 5,557,219 A | 9/1996 | Norwood et al. | 326/49 |
| 5,589,783 A | 12/1996 | McClure | 326/71 |
| 5,689,195 A | 11/1997 | Cliff et al. | 326/41 |

(Continued)

FOREIGN PATENT DOCUMENTS

EP 0 757 124 B1 5/2001

OTHER PUBLICATIONS

B. Gilbert, "The Multi-Tahn Principle: A Tutorial Overview," IEEE Journal of Solid-State Circuits, vol. 33, No. 1, Jan. 1998.

(Continued)

*Primary Examiner*—Vibol Tan
*Assistant Examiner*—Jany Tran
(74) *Attorney, Agent, or Firm*—Dorsey & Whitney LLP

(57) ABSTRACT

Embodiments of the present invention provide electronic devices, memory devices and methods of driving an on-chip signal off a chip. In one such embodiment, an on-chip signal and a second signal complementary to the on-chip signal are generated and provided to the two inputs of a differential driver. One output of the differential driver circuitry is coupled to an externally-accessible output terminal of the package. The other output may be terminated off the chip, but within the package. By routing the output signal and a second complementary output through the package, crosstalk potentially caused by the output signal can be reduced. Simultaneous switching output noise may also be reduced through use of a current-steering differential driver topology. Signal symmetry may also improve, reducing inter-symbol interference.

24 Claims, 5 Drawing Sheets

U.S. PATENT DOCUMENTS

| | | | | |
|---|---|---|---|---|
| 5,742,178 | A | 4/1998 | Jenkins, IV et al. | 326/33 |
| 5,764,086 | A | 6/1998 | Nagamatsu et al. | 327/65 |
| 5,801,548 | A | 9/1998 | Lee et al. | 326/44 |
| 5,936,423 | A | 8/1999 | Sakuma et al. | 326/16 |
| 5,939,904 | A | 8/1999 | Fetterman et al. | 327/67 |
| 5,942,940 | A | 8/1999 | Dreps et al. | 330/253 |
| 5,958,026 | A | 9/1999 | Goetting et al. | 710/52 |
| 5,970,255 | A | 10/1999 | Tran et al. | 395/893 |
| 5,977,796 | A | 11/1999 | Gabara | 326/86 |
| 6,040,712 | A | 3/2000 | Mejia | 326/82 |
| 6,154,047 | A | 11/2000 | Taguchi | 326/30 |
| 6,175,952 | B1 | 1/2001 | Patel et al. | 716/18 |
| 6,201,405 | B1 | 3/2001 | Hedberg | 326/30 |
| 6,215,326 | B1 | 4/2001 | Jefferson et al. | 326/41 |
| 6,222,388 | B1 | 4/2001 | Bridgewater, Jr. | 326/86 |
| 6,236,231 | B1 | 5/2001 | Nguyen et al. | 326/39 |
| 6,252,419 | B1 | 6/2001 | Sung et al. | 326/38 |
| 6,281,715 | B1 | 8/2001 | DeClue et al. | 327/65 |
| 6,288,581 | B1 | 9/2001 | Wong | 327/108 |
| 6,373,278 | B1 | 4/2002 | Sung et al. | 326/38 |
| 6,377,076 | B1 | 4/2002 | Gauthier | 326/86 |
| 6,433,579 | B1 | 8/2002 | Wang et al. | 326/38 |
| 6,650,140 | B2 | 11/2003 | Lee et al. | 326/39 |
| 6,724,328 | B1 | 4/2004 | Lui et al. | 341/101 |
| 6,836,149 | B2 | 12/2004 | Chow | 326/83 |
| 6,854,044 | B1 | 2/2005 | Venkata et al. | 711/201 |
| 6,940,302 | B1 | 9/2005 | Shumarayev et al. | 326/26 |
| 6,956,407 | B2 | 10/2005 | Baig et al. | 327/65 |
| 6,977,534 | B2 | 12/2005 | Radelinow | 327/112 |
| 7,224,180 | B2 | 5/2007 | Hargrove et al. | 326/30 |
| 7,365,570 | B2 | 4/2008 | King | 326/82 |
| 2003/0052709 | A1 | 3/2003 | Venkata et al. | 326/37 |
| 2003/0141919 | A1 | 7/2003 | Wang et al. | 327/390 |
| 2004/0140837 | A1 | 7/2004 | Venkata et al. | 327/235 |
| 2004/0207430 | A1* | 10/2004 | Jang | 326/60 |
| 2004/0233704 | A1* | 11/2004 | Shizuki | 365/154 |
| 2004/0263227 | A1* | 12/2004 | Baker et al. | 327/158 |
| 2005/0095988 | A1 | 5/2005 | Bereza et al. | 455/67.14 |
| 2005/0160327 | A1 | 7/2005 | Baig et al. | 714/47 |
| 2006/0017462 | A1 | 1/2006 | Kao | 326/62 |
| 2006/0290375 | A1* | 12/2006 | Kao | 326/26 |

OTHER PUBLICATIONS

"Block Diagram for NSM LVDS Output Buffer," "Circuit Trace from National Semiconductor Device," National Semiconductor Corporation.

K. Farzan, "A CMOS 10-Gb/s Power-Efficient 4-PAM Transmitter," IEEE Journal of Solid-State Circuits, vol. 39, No. 3, Mar. 2004, pp. 529-532.

"LVDS Owner's Manual; Design Guide," National Semiconductor Corporation, Spring 1997, Chapter 1, pp. 1-7.

"ORCA Series 3 Field-Programmable Gate Arrays, Preliminary Data Sheet, Rev. 01," Lucent Technologies Inc., Microelectronics Group, Allentown, PA, Aug. 1998, pp. 1-80.

"Optimized Reconfigurable Cell Array (ORCA), OR3Cxxx/OR3Txxx Series Field-Programmable Gate Arrays, Preliminary Product Brief," Lucent Technolgies Inc., Microelectronics Group, Allentown, PA, Nov. 1997, pp. 1-7 and unnumbered back cover.

Patel, R. et al., "A 3.3-V Programmable Logic Device that Addresses Low Power Supply and Interface Trends," *IEEE 1997 Custom Integrated Circuits Conference*, May 1997, pp. 539-542.

"Using Phase Locked Loop (PLLs) in DL6035 Devices, Application Note," Dyna Chip Corporation, Sunnyvale, CA, 1998, pp. i and 1-6.

"Using the Virtex Delay-Locked Loop, Application Note, XAPP132, Oct. 21, 1998 (Version 1.31)," Xilinx Corporation, Oct. 21, 1998, pp. 1-14.

"Virtex 2.5V Field Programmable Gate Arrays, Advanced Product Specification, Oct. 20, 1998 (Version 1.0)," Xilinx Corporation, Oct. 20, 1998, pp. 1-24.

"DY6000 Family, Fast Field Programmable Gate Array, DY6000 Family Datasheet," Dyna Chip Corporation, Sunnyvale, CA, Dec. 1998, pp. 1-66.

* cited by examiner

DEVICES AND METHODS FOR DRIVING A SIGNAL OFF AN INTEGRATED CIRCUIT

TECHNICAL FIELD

This invention relates to devices and methods for driving a signal off a chip.

BACKGROUND OF THE INVENTION

Integrated circuit chips formed on a substrate are packaged to connect with externally-accessible terminals. The packaging interconnects, system board, and downstream electronics present a load to the chip circuitry. Driver circuitry is used to drive the signals generated on the chip off of the chip while shielding the signal generating circuitry on the chip from the load presented by the connections and further circuits off the chip.

An example of a single-ended driver is shown in FIG. 1. A single input is provided to the gate 101 of a transistor 100. The voltage at the gate 101 is transferred to the output 102. A resistor 103 is coupled between a positive supply voltage 105 and the transistor 100 and ensures the transistor 100 is in the proper operating range. A third terminal of the transistor 100 is tied to ground 106. This simple circuit amplifies the strength of the out-going signal while shielding circuitry attached to the input from the load presented by downstream interconnects and circuitry attached to the output.

As signaling rates increase to 1 Gigabit/second and above, however, maintaining symmetric signals from the single-ended buffer when a signal goes high and when a signal is pulled low, becomes difficult. Asymmetries in these signals exacerbate inter-symbol interference.

Further, a large number of output buffers are provided for devices having a large number of outputs, such as memory devices. The output buffers are tied, directly or indirectly, to positive power supply and ground nodes on the integrated circuit chip. These supplies are, in turn, tied to the package or board supplies through various connections. Accordingly, the positive power supply and ground nodes themselves have some inductance and resistance associated with them. The ground and source voltages, such as nodes 105 and 106 are therefore not ideal. When large numbers of buffers switch, they may actually affect the voltage at nodes 105 and 106, a phenomenon known as ground bounce or simultaneous switching output noise.

Prior systems cope with simultaneous switching output noise through data bus inversion, where the data is inverted at times in an attempt to balance the number of 1s and 0s communicated or through minimizing the number of transitioning signals during the communication. Data bus inversion requires an additional output to indicate when the data is inverted, and when it is not.

Still further, electrical connectors such as wire bonds or conductive traces are used to route signals from a chip to the externally-accessible terminals of a package. Because of the space constraints of the package, these signaling lines can be close enough together to cause cross-talk between the lines.

There is a need for driver circuitry capable of driving a signal off of a chip, but having reduced simultaneous switching output noise and inter-symbol interference. It is also desirable to reduce cross-talk between signaling lines.

DETAILED DESCRIPTION

One or more embodiments of the present invention provide differential driver circuitry. An on-chip signal and a second signal complementary to the on-chip signal are generated and provided to the two inputs of a differential driver. These signals may represent command or address information in a memory controller, data accessed from an array in a memory device, or any other dataset requiring transmission between chips. One output of the differential driver circuitry is coupled to an externally-accessible output terminal of the package. The other output is terminated off the chip, but within the package. In one embodiment, the second output is terminated at a termination circuit adjacent to the externally-accessible terminal receiving the output signal. By routing the output signal and a second complementary output from the on-chip differential driver through the package, crosstalk potentially caused by the output signal is reduced. An unrelated adjacent signaling line feels nearly opposite effects from the two connectors carrying complementary signals, reducing crosstalk. Certain details are set forth below to provide a sufficient understanding of embodiments of the invention. However, it will be clear to one skilled in the art that embodiments of the invention may be practiced without several of these particular details. In some instances, well-known circuits, control signals, timing protocols, and software operations have not been shown in detail in order to avoid unnecessarily obscuring the described embodiments of the invention.

Figure 1:
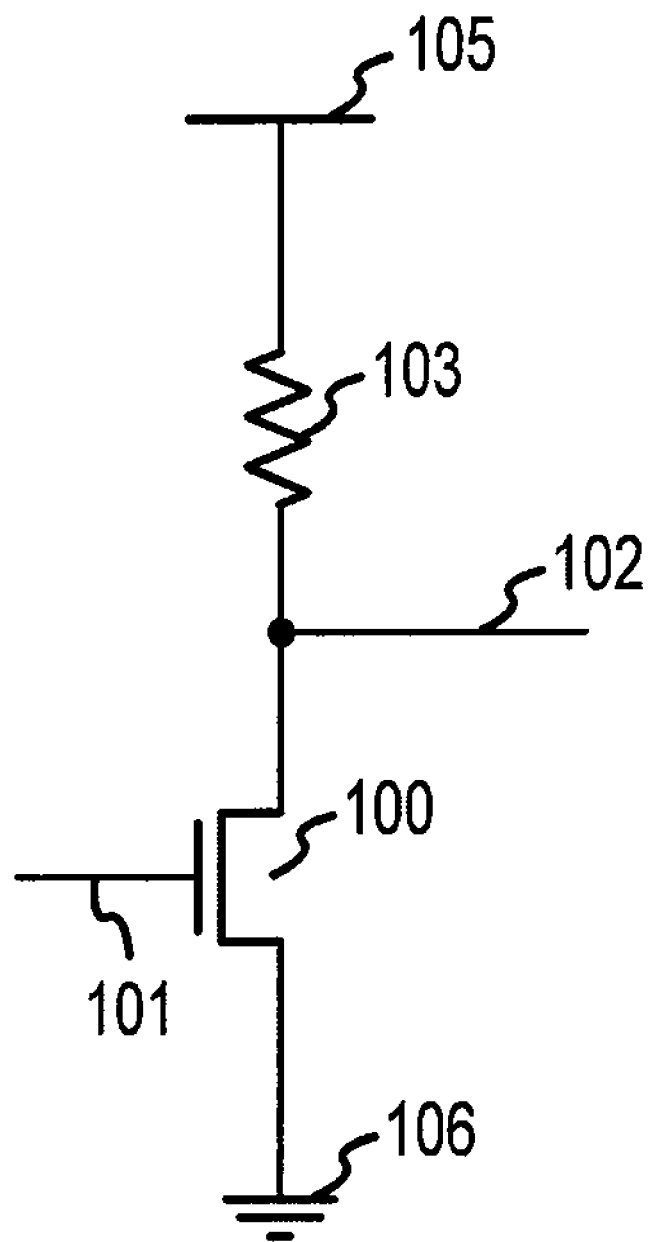
FIG. 1 is a schematic diagram of a single-ended driver known in the art.
Figure 2:
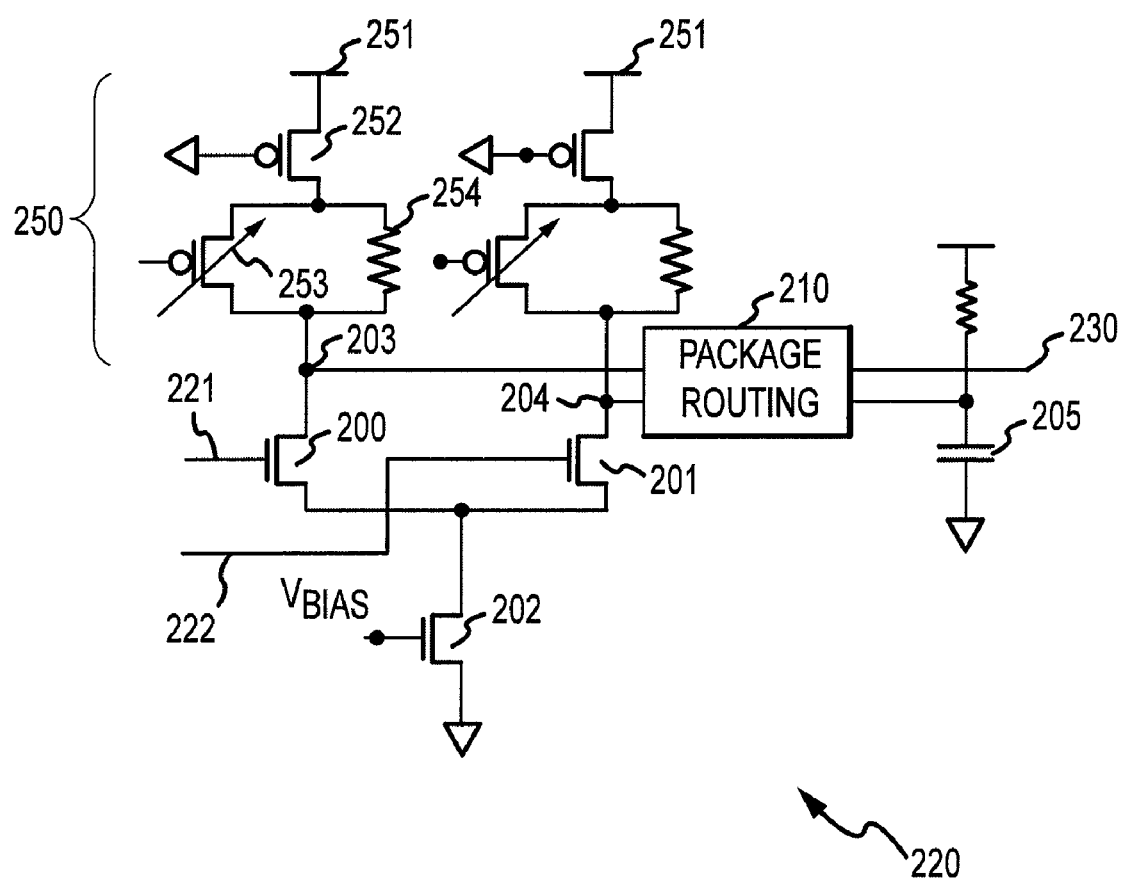
FIG. 2 is a schematic diagram of differential driver circuitry according to an embodiment of the present invention.

FIG. 2 depicts driver circuitry 220 according to an embodiment of the present invention. The driver circuitry 220 has a first input terminal 221 and a second input terminal 222. One of the input terminals is coupled to receive a signal. The received signal is the signal the driver circuitry will drive off of the chip and eventually off of the package, and is generated on the chip in one embodiment. The other input is coupled to receive a second input signal, complementary to the first, on-chip signal. The input terminals 221 and 222 therefore receive complementary signals, which do not necessarily exhibit opposite polarities. For example, the complementary signals may transition between the full positive supply level and a second level midway between the positive supply level and ground, with the true signal representing binary 1s and 0s with the full positive supply level and the midpoint level, respectively, and the corresponding complementary signal representing binary 1s and 0s with the midpoint voltage and the full positive supply level, respectively. The driver circuitry 220 further includes a first output terminal 203 and a second output terminal 204. The output signals generated at the first and second output terminals 203 and 204 are also complementary signals.

A variety of circuits may be used to achieve the driver circuitry. In the embodiment of FIG. 2, a differential pair of transistors 200 and 201 receive the respective signals from input terminals 221 and 222. Current source circuitry 202 is coupled to the transistors 200 and 201 to ensure that a relatively constant current is drawn through the differential pair. In the embodiment of FIG. 2, the current source circuitry 202 is a transistor having an appropriate bias voltage applied to the gate. Because complementary signals are generated in each leg of the differential driver circuitry, and the current source circuitry draws a relatively constant current, symmetry in the driver circuitry is improved between pull-up and pull-down, and both ground bounce and positive supply noise are reduced. Accordingly, data bus inversion is not necessary to counteract the effects of simultaneous switching output noise. The pins, area, power and design time required for DBI can accordingly be avoided, or DBI can be implemented to target the issue of crosstalk within the package more directly, instead of targeting the SSO noise. Driver circuitry utilizing a differential pair of transistors coupled to current source circuitry is also desirable because the configuration yields very linear behavior, allowing for predictable behavior and ease of interconnect modeling, simulation and verification. In particular, statistical analysis can be utilized to analyze the driver's performance. The advantages of this configuration will, in many applications, outweigh the disadvantages of a constant tail current burning power and greater area required by the differential circuit than the simpler single-ended driver. Additional circuitry 250 is provided to couple each leg of the driver circuitry 220 to a supply node 251. The additional circuitry 250 generally presents a resistive load to the driver circuitry and ensures proper operation. A variety of additional circuitry 250 may be used, as understood in the art. In the embodiment shown in FIG. 2, two transistors 252 and 253 are provided, one in parallel with a resistor 254. Similar transistors are provided in the second leg of the driver circuitry. The transistor 253 is adjustable, allowing a designer to more accurately match the channel impedance. The parallel resistor 254 is provided to advantageously improve the linearity of the circuit, but its presence is optional in such an embodiment.

Other differential driver circuitry embodiments may be used with embodiments of the present invention. The differential pair configuration, however, provides a circuit where the voltage swing available at the output terminals 203 and 204 is proportional to the bias current provided by the current source circuitry 202. The available voltage swing can be changed during operation by adjusting the current pulled by the current source circuitry 202. Similarly, the power consumption of the driver can be adjusted by adjusting the current pulled by the current source circuitry 202.

Signals from the output terminals 203 and 204 are routed, off the chip containing the driver circuitry, through a package 210. The output from the first output terminal 203 in FIG. 2 is coupled to an externally-accessible output terminal 230 of the package. The output from the second output terminal 204 is terminated with termination circuit 205. The termination circuit 205 is shown in FIG. 2 as a capacitor tied to ground. In other embodiments, both a resistor and a capacitor are used. The capacitance of the termination circuit 205 can be chosen to simulate the additional capacitance exhibited by the channel to which the first output terminal 203 is coupled. However, any termination circuitry may be used that reduces signal reflection in the second leg of the driver circuitry. In one embodiment, the termination circuitry includes a transistor coupled as a capacitor.

Figure 3:
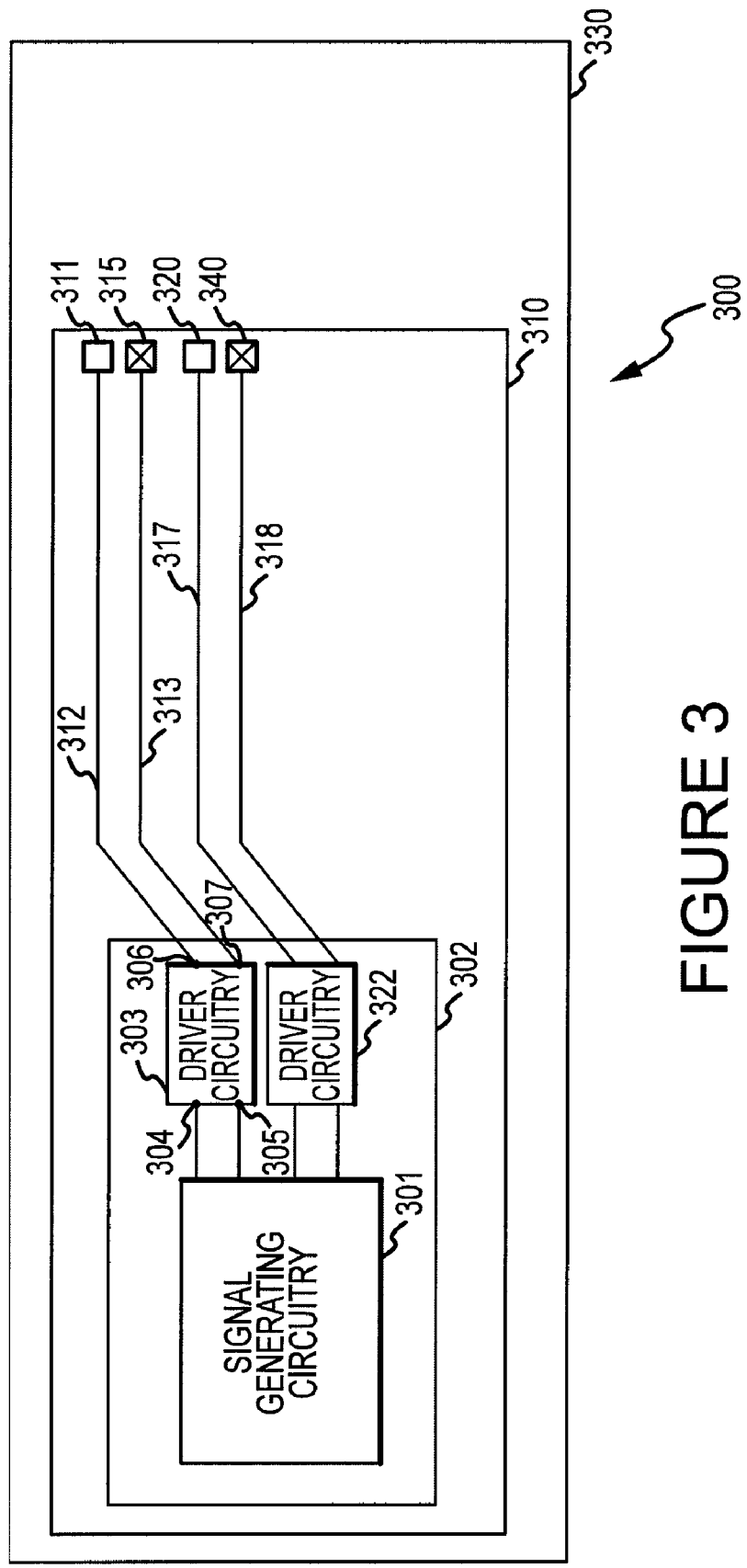
FIG. 3 is a schematic diagram of a device according to an embodiment of the present invention.

FIG. 3 depicts a block diagram representation of a device 300 according to an embodiment of the present invention. Signal generating circuitry 301 is present on an integrated circuit chip 302. The circuitry 301 may have any functionality, as an example, the signal generating circuitry 301 may include an array of memory cells. The signal generating circuitry 301 is operable to generate an on-chip signal. In some embodiments, the signal generating circuitry 301 does not generate the on-chip signal alone, but receives a signal from another component, not shown in FIG. 3, that may be on or off the chip. The signal generating circuitry 301 may then modify the received signal in some way, such as buffering, filtering, storing, or otherwise manipulating the signal to generate the on-chip signal. The signal generating circuitry 301 is coupled to driver circuitry 303. The driver circuitry 220 of FIG. 2, for example, may be used as the driver circuitry 303. As described above, the driver circuitry is differential and has two input terminals 304 and 305. One of the input terminals is coupled to receive a signal generated by the signal generating circuitry 301, and the other input terminal is coupled to receive a complement of that signal, such that the input terminals 304 and 305 receive complementary signals. The complementary signal may be generated by the signal generating circuitry 301 or by other circuitry not shown in FIG. 3. The driver circuitry 303 may be located on the integrated circuit chip 302. Further second driver circuitry 322 is provided to receive another signal from the signal generating circuitry 301. Although only two driver circuitry units are shown in FIG. 3, it is to be understood that any number of driver circuitry units may be provided, as needed based on the signals generated by the signal generating circuitry 301 and the number of externally-accessible output terminals on the package.

The integrated circuit chip 302 is located within a package 310. The package has at least one externally-accessible terminal, such as the externally-accessible terminal 311. Externally-accessible terminal 320 is also provided in FIG. 3 for connecting to the second driver circuitry unit 322. The integrated circuit 302 may be connected to the externally accessible terminals of the package in any way known in the art, such as by wirebonding or flip chip bonding. As described above, the driver circuitry 303 has two output terminals 306 and 307, where complementary output signals are produced. A first electrical connector 312 couples the output 306 to the externally-accessible terminal 311. A second electrical connector 313 couples the output 307 to a termination circuit 315.

The second output of the driver circuitry 307 is shown terminated inside the package 310 and off the integrated circuit chip 302. The electrical connectors 312 and 313 are routed through the package alongside one another for some distance. Because the electrical connectors 312 and 313 carry complementary signals, crosstalk between the connectors and other signal carrying lines (such as connector 317 or 318) can be reduced. This differential routing of the connectors 312 and 313 through the package 310 can also improve the matching in the load seen by the two output terminals of the driver circuitry 307, because they can both be loaded by a similar connector through the package 310.

The termination circuit 315 is located adjacent the externally-accessible terminal 311 such that the connectors 312 and 313 are both routed through the package 310. The termination circuit may be located at other locations within the package, however. Preferably, the electrical connector 313 is greater than or equal to half the length of the connector 312. In other embodiments, the electrical connector 313 is greater than or equal to two-thirds the length of the connector 312, in other embodiments the electrical connector 313 is greater than or equal to three-quarters the length of the connector 312. In the embodiments where the connectors 312 and 313 are different lengths, the termination circuit 315 is placed at the end of the connector 313 wherever it ends within the package 310. In other embodiments the connector 313 is substantially the same length as the connector 312, with the length of connector 313 adjusted to accommodate the placement of the termination circuit 315 adjacent to the externally-accessible terminal 311.

To assist in the reduction of crosstalk caused by the connectors 312 and 313, they are routed adjacent to one another in the package in some embodiments. No other signaling lines are run between the connectors 312 and 313 in some embodiments. The distance between the connectors 312 and 313 will be selected based on the requirements of the package and the physical connectors taking into consideration factors such as the desired trace impedance, location of nearest possible return paths, shielding, and other relevant variables. In one embodiment, the connectors 312 and 313 are placed $5/1000$ of an inch apart, with an $8/1000$ of an inch spacing between the next adjacent unrelated connector. In general, spacing between complementary connectors and between pairs of complementary connectors may be on the order of thousandths of an inch in some embodiments. The spacing may of course vary according to the particular embodiment and connector used, but the connectors 312 and 313 are generally spaced in a manner that reduces crosstalk to a neighboring connector. The electrical connectors 312 and 313 may include any suitable electrical connectors such as wire bonds or conductive traces on a package substrate, in one embodiment conductive traces on a package substrate may connect to solder balls on the package in flip chip assemblies.

Figure 4:
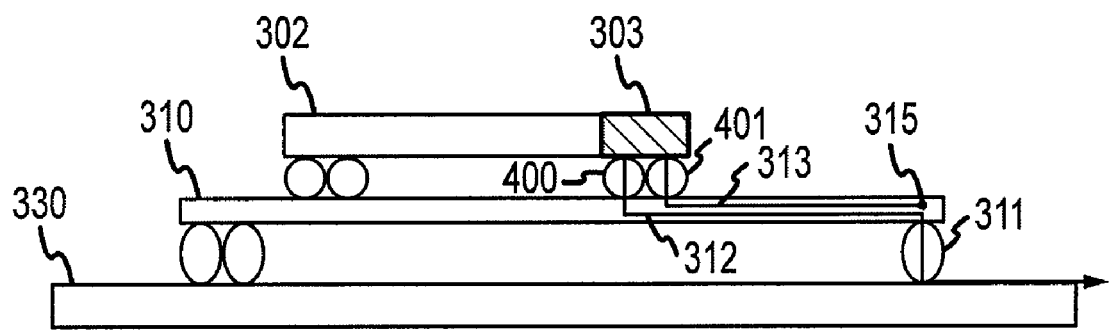
FIG. 4 is a side view schematic diagram of a device according to an embodiment of the present invention.

The externally accessible terminals, including terminals 311 and 320, may then be attached to a system board 330 through methods known in the art, such as wirebonding or flip chip connections. FIG. 4 depicts a schematic side view of an embodiment of the device 300 of FIG. 3. The integrated circuit chip 302 contains the driver circuitry 303. The driver circuitry 303 may not necessarily extend through the depth of the integrated circuit chip 302 substrate, as shown in FIG. 4, but merely be present at or near the surface of the chip 302, as understood by those skilled in the art. FIG. 4 is not to scale, but instead intended to convey the general relationship between the components. The two output terminals of the driver circuitry 303 are connected to the package 310 through flip chip connections 400 and 401, which may include solder balls. The electrical connector 313 extends to the edge of the package 310 and terminates at the termination circuit 315. Electrical connector 312 extends to an area adjacent the termination circuit 315 where the electrical connector 312 couples to the externally-accessible terminal 311, a package bump connection as depicted in the embodiment of FIG. 4, which, in turn, contacts the system board 330. The electrical connectors 312 and 313 are depicted in the embodiment of FIG. 4 as conductive traces on a package board. However any type of electrical connector may be used. The connectors 312 and 313 are depicted on a top and bottom surface of the package 310 for ease of illustration only, and they may generally both be found on a top surface, or in any configuration known in the art.

Figure 5:
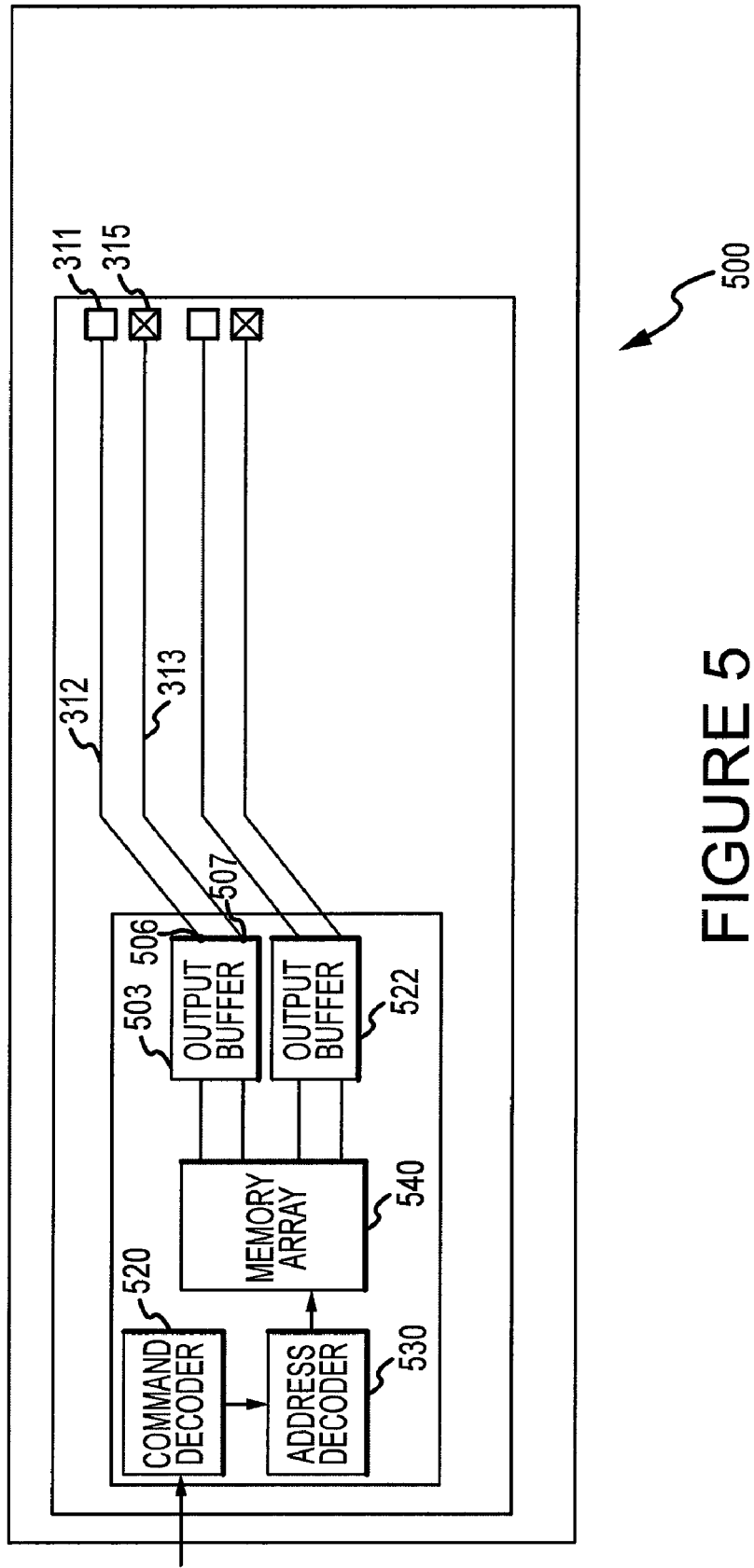
FIG. 5 is a schematic diagram of a memory device according to an embodiment of the present invention.

An embodiment of a memory device 500 according to the present invention is shown schematically in FIG. 5. A command decoder 520 operates to receive a command signal, such as a read command, and decode the signal to execute the command. An address decoder 530 decodes an address requested and selects a cell from the array of memory cells 540 corresponding to the requested address. The memory cells may generally be any type of memory, including DRAM cells, and may be arranged in any manner. Data read from the array 540 is coupled through an appropriate output buffer. Two output buffers 503 and 522 are shown in FIG. 5, however, the number of output buffers used depends on the number of memory cells in the array 540 and the output configuration desired. The output buffers 503 and 522 include driver circuitry as described above, such as driver circuitry unit 303. Two electrical connectors 312 and 313 couple the output terminals to the externally-accessible terminal 311 and the termination circuit 315 as described above. It will be understood, by one skilled in the art, that several intermediate circuits may reside in the data path between the memory array and the driver, such as, serialization circuitry, data encoding circuitry, and the like. It will also be understood that, while embodiments of driver circuitry described herein may be used for transmitting data signals off of a chip, embodiments of the invention may be used to transmit clock signals as well. Other signals may be carried by other embodiments of the invention.

From the foregoing it will be appreciated that, although specific embodiments of the invention have been described herein for purposes of illustration, various modifications may be made without deviating from the spirit and scope of the invention.

What is claimed is:

1. An electronic device including a package, the electronic device comprising:
   at least one externally-accessible terminal of the package configured to couple to a channel; and
   an integrated circuit chip, the integrated circuit chip including:
      driver circuitry operable to receive an on-chip signal and drive the on-chip signal off of the chip, the driver circuitry having first and second input terminals and first and second output terminals, one of the first and second input terminals coupled to receive the on-chip signal and the other of the first and second input terminals coupled to receive a complement of the on-chip signal, the driver circuitry operable to produce an output signal at the first output terminal and a complement of the output signal at the second output terminal;
   a first electrical connector coupled between one of the first or second output terminals and the at least one externally-accessible terminal;
   a termination inside the package and adjacent to the externally-accessible terminal, the termination operable to terminate a received signal and having an impedance value related to a capacitance of the channel; and
   a second electrical connector, not coupled to any of the externally-accessible terminals of the package, the second electrical connector coupled between the other of the first or second output terminals and the termination and routed through the package alongside the first electrical connector for substantially an entire length of the first electrical connector.

2. The electronic device of claim 1 wherein the termination and the externally-accessible terminal are located at an edge of the package.

3. The electronic device of claim 1 wherein the second electrical connector is located sufficiently near the first electrical connector to reduce crosstalk caused by the first electrical connector.

4. The electronic device of claim 1 wherein the first and second electrical connectors are of substantially the same length.

5. An electronic device according to claim 1 wherein the first and second electrical connectors include wire bonds.

6. An electronic device according to claim 1 wherein the first and second electrical connectors include conductive traces on a package substrate.

7. An electronic device according to claim 1 wherein the termination includes a capacitance and a resistance comprising a capacitance chosen to simulate a capacitance exhibited by the channel to which the at least one externally-accessible terminal is configured to be coupled.

8. An electronic device according to claim 1 further comprising signal generating circuitry operable to generate the on-chip signal and wherein the signal generating circuitry and the driver circuitry are disposed on a common semiconductor substrate.

9. An electronic device according to claim 8 wherein the signal generating circuitry includes a memory cell.

10. An electronic device according to claim 8 wherein the on-chip signal includes a data signal.

11. An electronic device according to claim 8 wherein the on-chip signal includes a clock signal.

12. An electronic device according to claim 1 wherein the driver circuitry includes a first transistor, a second transistor, and current source circuitry, the first and second input terminals of the driver circuitry including gates of the first and second transistors, respectively, and the first and second transistors each including a respective terminal coupled to the current source circuitry.

13. An electronic device including a package, the electronic device comprising:
   at least one externally-accessible terminal of the package; and
   an integrated circuit chip, the integrated circuit chip including:
      driver circuitry operable to receive an on-chip signal and drive the on-chip signal off of the chip, the driver circuitry having first and second input terminals and first and second output terminals, one of the first and second input terminals coupled to receive the on-chip signal and the other of the first and second input terminals coupled to receive the complement of the on-chip signal, the driver circuitry operable to produce an output signal at the first output terminal and a complement of the output signal at the second output terminal;
      a first electrical connector coupled between one of the first or second output terminals and the at least one externally-accessible terminal;
      a termination operable to terminate a received signal, the termination not coupled to any of the externally-accessible terminals;
      a second electrical connector coupled between the other of the first or second output terminals and the termination and routed though the package alongside the first electrical connector within the package for substantially an entire length of the first electrical connector.

14. An electronic device according to claim 13 wherein the length of the second electrical connector is greater than or equal to at least three-quarters of the length of the first electrical connector.

15. An electronic device according to claim 13 wherein the integrated circuit chip further includes additional circuitry coupled between a supply voltage and the driver circuitry to present a resistive load to the driver circuitry.

16. The electronic device of claim 15 wherein the additional circuitry includes an adjustable transistor to select a resistance of the additional circuitry to simulate resistance of a channel to which the at least one externally-accessible terminal is coupleable.

17. The electronic device of claim 13 further comprising signal generating circuitry operable to generate the on-chip signal and wherein the signal generating circuitry includes a memory cell.

18. The electronic device of claim 13 wherein the termination is selected to reduce signal reflection in the second electrical connector.

19. A memory device comprising:
   a package having at least one externally-accessible terminal configured to couple to a channel;
   an array of memory cells on a substrate within the package;
   a command decoder operable to receive a command signal and execute the command;
   an address decoder operable to receive an address request from the command decoder and select a cell within the array of memory cells corresponding to the requested address;
   an output buffer on the substrate coupled to receive a signal from at least one of the cells in the array of memory cells, the output buffer operable to receive a data signal from the at least one cell and drive the data signal off the substrate, the output buffer comprising:
      first and second input terminals and first and second output terminals, one of the first and second input terminals coupled to receive the data signal and the other of the first and second input terminals coupled to receive the complement of the data signal, the output buffer operable to produce an output signal at the first output terminal and a complement of the output signal at the second output terminal;
   a first electrical connector coupled between one of the first or second output terminals and the at least one externally-accessible terminal;
   a termination inside the package, and adjacent to the externally-accessible terminal, the termination not coupled to any of the externally-accessible terminals, the termination operable to terminate a received signal and having an impedance value related to an impedance of the channel; and
   a second electrical connector coupled between the other of the first or second output terminals and the termination and routed through the package alongside the first electrical connector for substantially an entire length of the first electrical connector.

20. The memory device of claim 19 wherein the first and second electrical connectors are routed through the package substantially alongside one another.

21. A method of driving an on-chip signal coupled to an externally-accessible terminal, the method comprising:
   receiving an on-chip signal;
   generating a second signal complementary to the on-chip signal;
   inputting the on-chip signal and the second complementary signal to a differential amplifier; and
   generating, with the differential amplifier, a first output signal and a second output signal complementary to the first output signal, wherein;
   the first output signal is coupled to the externally-accessible terminal off of the chip; and wherein
   the second output signal is routed through the package in substantially a same manner as the first output signal and coupled to a termination adjacent the externally-accessible terminal and not coupled to an externally-accessible terminal.

22. The method according to claim 21 wherein the first output signal is coupled through a first electrical connector and the second output signal is coupled through a second electrical connector sufficiently close to the first electrical connector to reduce cross-talk from the first electrical connector.

23. The method according to claim 21 wherein the act of generating the second complementary signal includes generating the second signal having opposite polarity to the on-chip signal.

24. The method according to claim 21 further comprising drawing a substantially constant current through the differential amplifier.

* * * * *

UNITED STATES PATENT AND TRADEMARK OFFICE
CERTIFICATE OF CORRECTION

PATENT NO. : 7,733,118 B2 Page 1 of 1
APPLICATION NO. : 12/043848
DATED : June 8, 2010
INVENTOR(S) : Timothy Hollis et al.

It is certified that error appears in the above-identified patent and that said Letters Patent is hereby corrected as shown below:

In column 8, line 22, in Claim 19, delete "package," and insert -- package --, therefor.

Signed and Sealed this

Seventeenth Day of August, 2010

David J. Kappos
*Director of the United States Patent and Trademark Office*